United States Patent [19]

Soneda et al.

[11] Patent Number: 4,584,608
[45] Date of Patent: Apr. 22, 1986

[54] SOLID STATE IMAGE PICKUP DEVICE

[75] Inventors: Mitsuo Soneda, Zama; Toshikazu Maekawa, Ebina; Takaji Ohtsu, Hatano, all of Japan

[73] Assignee: Sony Corporation, Tokyo, Japan

[21] Appl. No.: 562,588

[22] PCT Filed: Apr. 9, 1983

[86] PCT No.: PCT/JP83/00108
§ 371 Date: Dec. 5, 1983
§ 102(e) Date: Dec. 5, 1983

[87] PCT Pub. No.: WO83/03729
PCT Pub. Date: Oct. 27, 1983

[30] Foreign Application Priority Data

Apr. 10, 1982 [JP] Japan .................................. 57-60097

[51] Int. Cl.[4] .............................................. H04N 3/14
[52] U.S. Cl. ......................................... 358/212; 357/24
[58] Field of Search .............................. 358/213, 212; 357/24 LR, 23.12

[56] References Cited
U.S. PATENT DOCUMENTS
4,209,806  6/1980  Koike et al. .................. 358/213

Primary Examiner—Gene Z. Rubinson
Assistant Examiner—Stephen Brinich
Attorney, Agent, or Firm—Hill, Van Santen, Steadman & Simpson

[57] ABSTRACT

A solid state image pickup device comprises a plurality of image pickup picture units ($E_{11}$ to $E_{mn}$) arrayed in horizontal and vertical rows and composed of first switching elements ($S_{11}$ to $S_{mn}$) and photoelectric transducers ($D_{11}$ to $D_{mn}$: 24) electrically connected to the first switching elements ($S_{11}$ to $S_{mn}$), and a plurality of second switching elements ($T'_1$ to $T'_n$) connected in common to the respective vertical rows of the first switching elements ($S_{11}$ to $S_{mn}$) in the image pickup picture units ($E_{11}$ to $E_{mn}$) and each composed of a depletion-mode insulated-gate field-effect transistors. The horizontal rows of the first switching elements ($S_{11}$ to $S_{mn}$) in the image pickup picture units ($E_{11}$ to $E_{mn}$) are selectively energizable and the second switching elements ($T'_1$ to $T'_n$) are also selectively energizable to deliver signals based on signal charge generated by the photoelectric transducers ($D_{11}$ to $D_{mn}$: 24) through the first and second switching elements ($S_{11}$ to $S_{mn}$, $T'_1$ to $T'_n$) so as to produce an image pickup signal output.

1 Claim, 8 Drawing Figures

FIG. 2 PRIOR ART
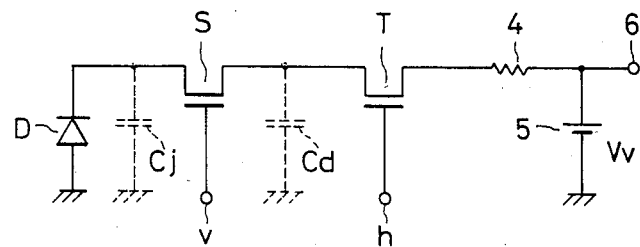
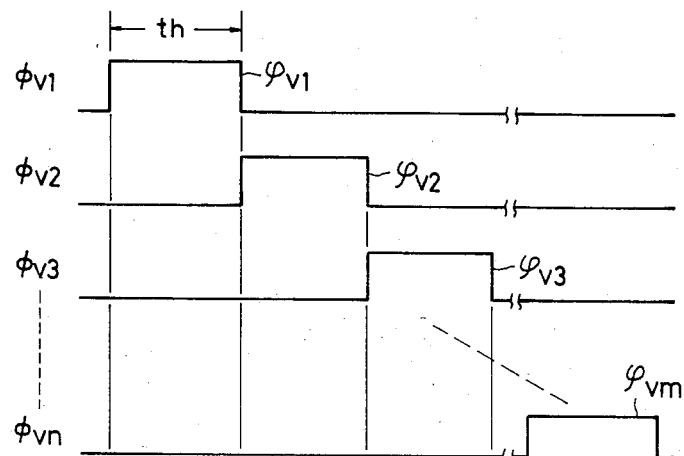
FIG. 3A
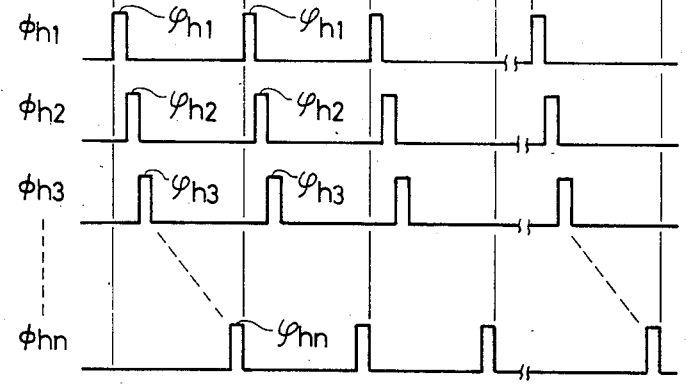
FIG. 3B

SOLID STATE IMAGE PICKUP DEVICE

TECHNICAL FIELD

This invention relates to a solid state image pickup device having an image pickup surface comprising a matrix of two-dimensionally arrayed image pickup picture units each comprising, in combination, a photoelectric transducer and a first switching element, in which signals based on signal charge produced by the respective rows of image pickup picture units are delivered successively to form an image pickup signal output through a plurality of second switching elements.

TECHNICAL BACKGROUND

There has been proposed a solid state image pickup apparatus comprising, as main components, a solid state image pickup device having an image pickup surface composed of a prescribed pattern, such as a matrix for example, of two-dimensionally arrayed image pickup picture units each comprising a photoelectric transducer and a switching element and additional switching elements disposed outside of the image pickup picture units for successively delivering, in a predetermined manner, signals based on signal charge produced by the image pickup surface, and a scanning circuit for selectively energizing the switching elements in the solid state image pickup device to deliver an image pickup signal output based on signal charge produced by the photoelectric transducers in the image pickup picture units. In the solid state image pickup device employed in such a solid state image pickup apparatus, each switching element is composed of an insulated-gate field-effect transistor (hereinafter referred to as a "MOS FET"), and the photoelectric transducers are composed of a plurality of photodetecting diodes provided respectively for the switching elements or a thin photoelectric conversion layer disposed over the two-dimensional array of the switching elements.

FIG. 1 shows an equivalent circuit of the solid state image pickup device that has heretofore been proposed, and a scanning circuit and an output circuit which are required for putting the solid state image pickup device into operation. The solid state image pickup device, generally designated at 1, is composed of enhancement-mode MOS FETs $S_{11}$ to $S_{mn}$ serving as switching elements, respectively, and arrayed as a matrix in horizontal rows (in the direction of an arrow H) and in vertical rows (in the direction of an arrow V), and photoelectric transducers $D_{11}$ to $D_{mn}$ each connected to one end, for example, a source of the corresponding one of the MOS FETs $S_{11}$ to $S_{mn}$. These MOS FETs $S_{11}$ to $S_{mn}$ and photoelectric transducers $D_{11}$ to $D_{mn}$ form an image pickup surface. Each combination of one of the MOS FETs $S_{11}$ to $S_{mn}$ and one of the photoelectric transducers $D_{11}$ to $D_{mn}$ forms one of image pickup picture units $E_{11}$ to $E_{mn}$.

The gates of the MOS FETs $S_{11}$ to $S_{mn}$ which constitute the image pickup picture units $E_{11}$ to $E_{mn}$ are connected in common in each horizontal row, and the groups of the gates connected in common are coupled respectively to m control terminals $v_1$ to $v_m$ which are supplied with vertical scanning signals from a vertical scanning circuit 2. The drains of the MOS FETs $S_{11}$ to $S_{mn}$ are connected in common in each vertical row, and groups of the drains connected in common are coupled to the sources, respectively, of enhancement-mode MOS FETs $T_1$ to $T_n$ serving as switching elements. The enhancement-mode MOS FETs $T_1$ to $T_n$ have their gates connected respectively to n control terminals $h_1$ to $h_m$ which are supplied with horizontal scanning signals from a horizontal scanning circuit 3. The drains of the MOS FETs $T_1$ to $T_n$ are connected in common through an output resistor 4 to a power supply 5 which supplies an operation voltage $V_V$. An output terminal 6 is led from a junction between the drains of the MOS FETs $T_1$ to $T_n$ connected in common and the output resistor 4.

The vertical scanning circuit 2 includes a shift register, for example, for issuing vertical scanning signals through the m control terminals $v_1$ to $v_m$ to the gates of the MOS FETs $S_{11}$ to $S_{mn}$ to successively energize the rows of the MOS FETs $S_{11}$ to $S_{mn}$. The horizontal scanning circuit 3 includes a shift register, for example, for issuing horizontal scanning signals having a frequency sufficiently higher than that of the vertical scanning signals from the vertical scanning circuit 2 through the n control terminals $h_1$ to $h_n$ to the gates of the MOS FETs $T_1$ to $T_n$ to successively energize the MOS FETs $T_1$ to $T_n$.

The ends of the photoelectric transducers $D_{11}$ to $D_{mn}$ remote from the sources of the MOS FETs $S_{11}$ to $S_{mn}$ are connected in common to an output terminal 7 to which a predetermined voltage $V_T$ is applied. In the case where the photoelectric transducers $D_{11}$ to $D_{mn}$ are composed of a plurality of photodiodes, for example, a ground potential is impressed on the terminal 7, and in the case where the photoelectric transducers $D_{11}$ to $D_{mn}$ are formed with a thin photoelectric conversion layer, a potential corresponding to a predetermined voltage (target voltage) $V_T$ is applied to the terminal 7.

Any desired one E of the image pickup picture units $E_{11}$ to $E_{mn}$ of the solid state image pickup device 1 thus constructed and a corresponding one T of the MOS FETs $T_1$ to $T_n$ are connected as shown in FIG. 2. In this example, the photoelectric transducer is composed of a photodiode, and the image pickup picture unit E has a photoelectric transducer D and an enhancement-mode MOS FET S. The photoelectric transducer D has one terminal connected to the source of the MOS FET S. The drain of the MOS FET S is connected to the source of an enhancement-mode MOS FET T having a drain connected to the output terminal 6 and to the power supply 5 through the output resistor 4. The other terminal of the photoelectric transducer D is grounded. The gate of the MOS FET S is connected to one v of the control terminals $v_1$ to $v_m$, while the gate of the MOS FET T is connected to one h of the control terminals $h_1$ to to $h_n$.

When light from an object falls on the image pickup picture units $E_{11}$ to $E_{mn}$ on the image pickup surface of the solid state image pickup device 1 thus constructed, the photoelectric transducers $D_{11}$ to $D_{mn}$ convert light energy into electric charge (electrons) which is dependent on guantities of incident light falling respectively on the image pickup picture units $E_{11}$ to $E_{mn}$. The electric charge is then stored in the respective sources of the MOS FETs $S_{11}$ to $S_{mn}$ as signal charge. A signal based on the stored signal charge is delivered to the output terminal 6 to produce an image pickup signal output when the horizontal rows of the MOS FETs $S_{11}$ to $S_{mn}$ are selectively energized by the vertical scanning signals issued from the vertical scanning circuit 2 and the MOS FETs $T_1$ to $T_n$ are selectively energized by the horizontal scanning signals issued from the horizontal scanning circuit 3.

For such vertical and horizontal scanning operation, the vertical scanning circuit 2 supplies to the m control terminals $v_1$ to $v_m$ with vertical scanning signals $\Phi_{v1}$ to $\Phi_{vm}$, respectively, as shown in FIG. 3A, and the horizontal scanning circuit 3 supplies the n control terminals $h_1$ to $h_n$ with horizontal scanning signals $\Phi_{h1}$ to $\Phi_{hn}$, respectively, as shown in FIG. 3B. More specifically, the vertical scanning signals $\Phi_{v1}$ to $\Phi_{vm}$ are composed of m pulses $\phi v1$ to $\phi_{vm}$ which have a high level during a period $t_h$ corresponding to one horizontal period of a video signal and are generated successively in one vertical period. The horizontal scanning signals $\Phi_{h1}$ to $\Phi_{hn}$ are composed of n pulses $\phi_{h1}$ to $\phi_{hn}$ which have a high level in a short period and are generated successively in the period of each of the pulses $\phi_{v1}$ to $\phi_{vm}$ of the vertical scanning signals $\Phi_{v1}$ to $\Phi_{vm}$. The MOS FETs $S_{11}$ to $S_{mn}$ and $T_1$ to $T_n$ are energized when their gates are supplied with the pulses $\phi_{v1}$ to $\phi_{vm}$ of the vertical scanning signals $\phi_{v1}$ to $\phi_{vm}$ and the pulses $\phi_{h1}$ to $\phi_{hn}$ of the horizontal scanning signals $\Phi_{h1}$ to $\Phi_{hn}$.

The pulse $\phi_{v1}$ of the vertical scanning signal $\Phi_{v1}$ delivered from the vertical scanning circuit 2 is first applied to the gates of the MOS FETs $S_{11}$ to $S_{1n}$ which constitute the first row to energize the MOS FETs $S_{11}$ to $S_{1n}$, whereupon a signal based on the signal charge stored in their sources is transmitted to the sources of the MOS FETs $T_1$ to $T_n$. During the period of the pulse $\phi_{v1}$, the pulses $\phi_{h1}$ to $\phi_{hn}$ of the horizontal scanning signals $\Phi_{h1}$ to $\Phi_{hn}$ from the horizontal scanning circuit 3 are successively applied to the gates of the MOS FETs $T_1$ to $T_n$, respectively, to energize the MOS FETs $T_1$ to $T_n$, successively. A signal current based on the signal that has been transmitted to the sources of the MOS FETs $T_1$ to $T_n$ is now allowed to flow through the output resistor 4. As a consequence, an image pickup signal output produced by the image pickup picture units $E_{11}$ to $E_{1n}$ corresponding respectively to the MOS FETs $S_{11}$ to $S_{1n}$ becomes continuously available from the output terminal 6.

Then, the pulse $\phi_{v2}$ of the vertical scanning signal $\Phi_{v2}$ is supplied to the gates of the MOS FETs $S_{21}$ to $S_{2n}$ which constitute the next horizontal row to energize these MOS FETs $S_{21}$ to $S_{2n}$, and the MOS FETs $T_1$ to $T_n$ are successively rendered conductive by the pulses $\phi_{h1}$ to $\phi_{hn}$ of the horizontal scanning signals $\Phi_{h1}$ to $\Phi_{hn}$. Therefore, an image pickup signal output produced by the image pickup picture units $E_{21}$ to $E_{2n}$ corresponding respectively to the MOS FET $S_{21}$ to $S_{2n}$ becomes continuously available from the output terminal 6. Likewise, image pickup signal outputs produced by the successive image pickup picture units up to the image pickup picture units $E_{m1}$ to $E_{mn}$ corresponding respectively to the MOS FETs $S_{m1}$ to $S_{mn}$ become sequentially available from the output terminal 6 in the respective periods each equivalent to one vertical period. The foregoing cycle of scanning operation will be repeated.

The derivation of the image pickup output signal from any desired one image pickup picture unit E on the image pickup surface of the foregoing prior solid state image pickup device 1 will be considered with reference to FIG. 2. First, it is supposed here that the MOS FET S constituting the image pickup picture unit E and the MOS FET T corresponding thereto are have been turned on to deliver an image pickup signal output from the image pickup picture unit E, and thereafter the MOS FET S and the MOS FET T are turned off again. At this time, a junction capacitance $C_j$, shown by a broken line in FIG. 2, across a P-N junction which forms the photoelectric transducer (photodiode) D is connected to the source of the MOS FET S and a stray capacitance $C_d$, shown by a broken line in FIG. 2, associated with the drain of the MOS FET S are charged by the operation voltage $V_V$, from the power supply 5 so that the potential at each of the drain and source of the MOS FET S becomes $V_V$.

When light falls on the photoelectric transducer D under such a condition, signal charge (electrons) is produced dependent on the quantity of the incident light, whereupon the potential of the source of the MOS FET S is lowered from $V_V$. The potential of the source of the MOS FET S can be lowered down to ground and this drop of the source potential is expressed with $\Delta V_S$ hereon. Thereafter, the pluse $\phi_v$ of one $\Phi_v$ of the vertical scanning signals $\Phi_{v1}$ to $\Phi_{vm}$ is supplied from the control terminal v to the gate of the MOS FET S to turn the latter on. Then, a signal based on the signal charge stored in the source of the MOS FET S is transferred to the drain of the MOS FET S, whereupon the potential at the drain of the MOS FET S is lowered by:

$$V_d = \frac{C_j}{C_j + C_d} \Delta V_s$$

Since the capacitance $C_d$ is much larger than the junction capacitance $C_j$, that is, $C_d >> C_j$, the reduction $\Delta V_d$ of the drain potential of the MOS FET S is so small that it can be regarded as substantially zero. Therefore, the potential of the drain of the MOS FET S is substantially $V_V$ while the signal is being transferred. Then, when the pulse $\phi_h$ of one $\Phi_h$ of the horizontal scanning signals $\Phi_{h1}$ to $\Phi_{hn}$ is supplied from the control terminal h to the gate of the MOS FET T to turn the latter on, the signal transferred to the drain of the MOS FET S, that is, the source of the MOS FET T, is further transferred to the drain of the MOS FET T. A signal current due to the transferred signal then flows through the output resistor 4 so that an image pickup signal output is now available from the output terminal 6.

The source potential of the MOS FET S is now able to vary from $V_V$ to ground level. Assuming that the enhancement-mode MOS FET S has a threshold voltage $V_{th}$ ($V_{th} > 0$), the level of the pulse $\phi_v$ of the vertical scanning signal $\Phi_v$ reguired to energize the MOS FET S to be conductive should reach at least $V_V + V_{th}$, and the low level portion of the vertical scanning signal $\Phi_v$ required to keep the MOS FET S to be nonconductive should be $V_{th}$ or smaller. Therefore, the vertical scanning signal $\Phi_v$ required to turn the MOS FET S on and off without fail should have the low level portion of a level of $V_{th} - V'$ and the pulse $\Phi_v$ of a level of $V_V + V_{th} + V'$ (where V' is a marginal voltage).

Further, assuming that the enhancement-mode MOS FET T has also the threshold voltage $V_{th}$, since the source potential of the MOS FET T varies from the level $V_V$ to the level $V_V - V_d$, the level of the pulse $\phi_h$ of the horizontal scanning signal $\Phi_h$ required to energize the MOS FET T to be conductive should reach at least $V_V + V_{th}$, and the low level portion of the horizontal scanning signal $\Phi_h$ required to keep the MOS FET T nonconductive should be $V_V - V_d + V_{th}$ or lower. Accordingly, the horizontal scanning signal $\Phi_h$ required to turn the MOS FET T on and off without fail should have the low level portion of a level of $V_V - V_d + V_{th} - V'$ and the pulse $\phi_h$ of the level of $V_V + V_{th} + V'$.

It follows from the foregoing that the level of the pulse $\phi_v$ of the vertical scanning signal $\Phi_v$ and the level of the pulse $\phi_h$ of the horizontal scanning signal $\Phi_h$ are required to be equal to each other, and therefore an attempt to equalize the low level portion of the horizontal scanning signal $\Phi_h$ to the low level portion of the vertical scanning signal $\Phi_v$ results in the fact that the pulse $\Phi_h$ of the horizontal scanning signal $\Phi_h$ and the pulse $\phi_v$ of the vertical scanning signal $\Phi_v$ have the same amplitude $(V_V + V_{th} + V') - (V_{th} - V') = V_V + 2V'$. This imposes a greater burden on the horizontal scanning circuit, and the MOS FET T suffers from a disadvantage in respect to the potential durability thereof.

Further, if the low level portion of the horizontal scanning signal $\Phi_h$ is set to be the ground level, then the amplitude of the pulse $\phi_h$ would be increased further and this would result in the difficulty in designing the shift register constituting the horizontal scanning circuit. Besides, if the low level portion of the horizontal scanning signal $\Phi_h$ is set to be higher than the ground level, then the number of external terminals of the horizontal scanning circuit would be increased. This is disadvantageous in that the number of external pins of an integrated circuit unit, which are desired to be as few as possible, is increased in the case where the horizontal scanning circuit is formed into an integrated circuit.

DISCLOSURE OF THE INVENTION

With the foregoing difficulties in view, it is an object of the present invention to provide a solid state image pickup device having a plurality of switching elements disposed outside of image pickup picture units on an image pickup surface for delivering a signal based on signal charge produced by the image pickup picture units, in which each of the switching element composed of a depletion-mode MOS FET so as to reduce the peak voltage value of a scanning signal for energizing the switching element and to lessen a burden on the scanning circuit with a result of increased design flexibility.

The solid state image pickup device according to the present invention comprises a plurality of image pickup picture units arrayed in horizontal and vertical rows and composed of first switching elements and photoelectric transducers electrically connected to the first switching elements, and a plurality of second switching elements connected in common to the respective vertical rows of the first switching elements in the image pickup picture units and each composed of a depletion-mode MOS FETs. The horizontal rows of the first switching elements of the image pickup picture units are successively turned on and the second switching elements are also successively turned on, so that a signal based on signal charge produced by the photoelectric transducers is derived through the first and second switching elements to produce an image pickup signal output.

The solid state image pickup device thus constituted according to the present invention can lessen the requirement on the potential durability of each of the switching elements disposed outside of the image pickup picture units and selectively turned on for delivering the signal based on the signal charge produced by the image pickup picture units. Furthermore, the burden on the circuit system for generating the scanning signals to turn the switching elements on and off can be reduced to increase flexibility in the design of such circuit. In particular, the solid state image pickup device of the invention has the advantage of reducing the number of external pins of an integrated circuit unit in the case where the circuit system for generating the scanning signals is formed into integrated circuits. Therefore, it is rendered easy to design the measure for providing potential duration and peripheral circuits in constructing an image pickup apparatus which generates video signals.

BRIEF DESCRIPTION OF THE DRAWINGS

FIGS. 1 and 2 are equivalent circuit diagrams schematically showing a conventional solid state image pickup device and its peripheral circuits;

FIGS. 3A and 3B are waveform diagrams used in common for explanations of the operation of the conventional solid state image pickup device and its peripheral circuits and the operation of a solid state image pickup device of the invention and its peripheral circuits;

EMBODIMENTS MOST PREFERABLE FOR WORKING OF THE INVENTION

Most preferable embodiments of the present invention will be described with reference to FIGS. 4 through 7.

Figure 1:
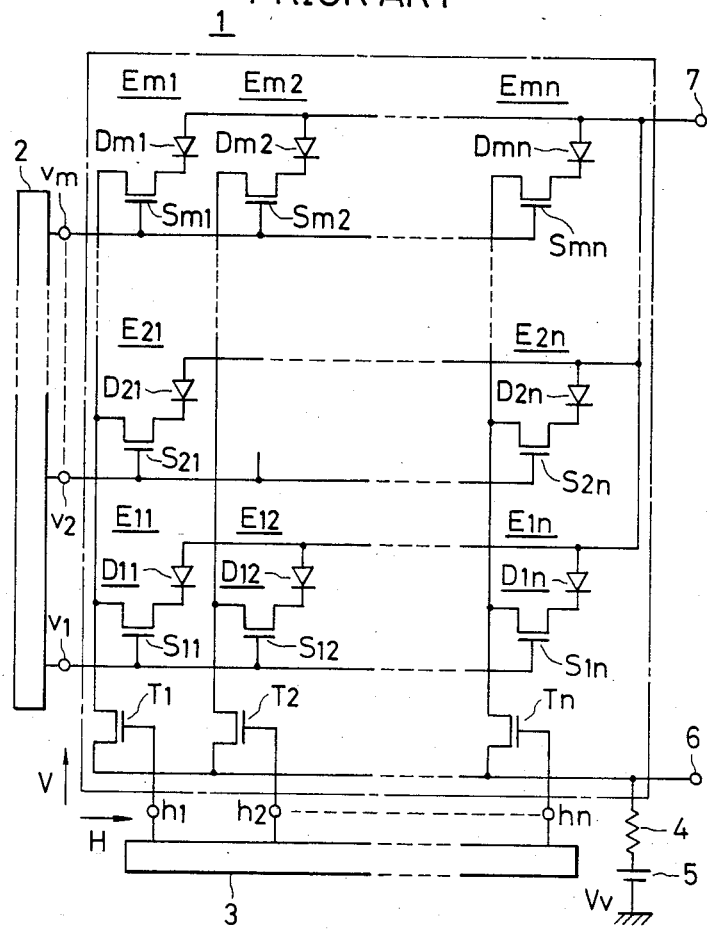
Figure 4:
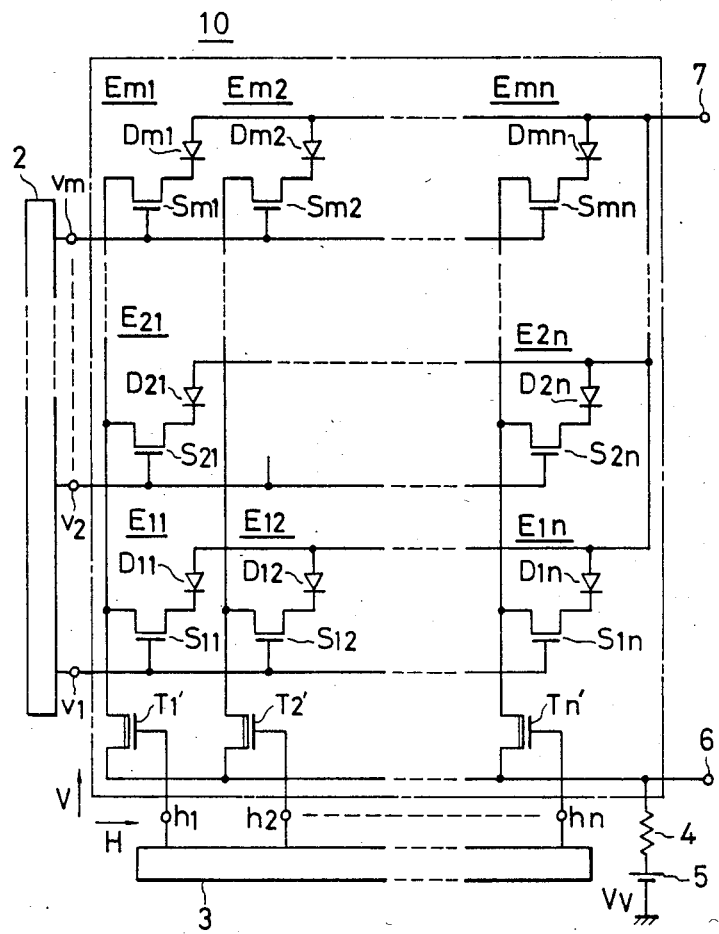
FIG. 4 is an equivalent circuit diagram schematically showing one example of a solid state image pickup device according to the present invention, and its peripheral circuits.

FIG. 4 shows an equivalent circuit of a solid state image pickup device according to the present invention and scanning and output circuits necessary for putting the solid state image pickup device into operation. Parts shown in FIG. 4 which correspond to those in FIG. 1 are marked with the same references and further description thereof will be omitted. The solid state image pickup device according to the present invention, which is generally designated as 10, has an image pickup surface composed of image pickup picture units $E_{11}$ to $E_{mn}$ arrayed in the same manner as that of the solid state image pickup device 1 illustrated in FIG. 1. The image pickup picture units $E_{11}$ to $E_{mn}$ contain therein respectively MOS FETs $S_{11}$ to $S_{mn}$. The sources of the MOS FETs $S_{11}$ to $S_{mn}$ in respective vertical rows are connected in common to the sources, respectively, of depletion-mode MOS FETs $T'_1$ to $T'_n$. The depletion-mode MOS FETs $T'_1$ to $T'_n$ have drains connected in common to the power supply 5 through the output resistor 4 and the output terminal 6 is led from the junction between these drains connected in common and the output resistor 4. The gates of the MOS FET $T'_1$ to $T'_n$ are connected respectively to n control terminals $h_1$ to $h_n$ to which the horizontal scanning signals are supplied. The other construction is the same as that of the solid state image pickup device 1 illustrated in FIG. 1.

Figure 5:
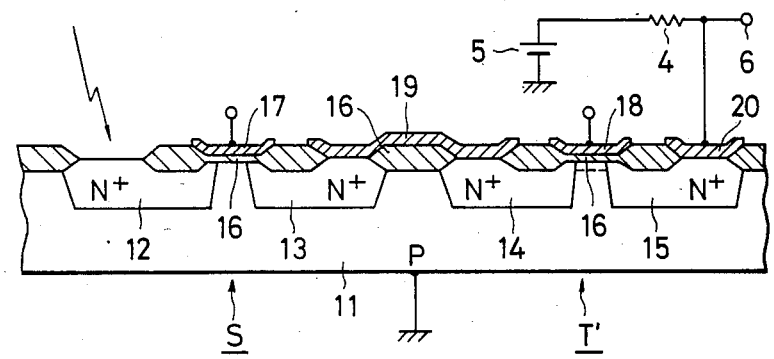
FIGS. 5 and 6 are a cross-sectional view and an equivalent circuit diagram of a specific construction for a portion of the solid state image pickup device of the invention shown in FIG. 4.

FIG. 5 shows a cross section of one of the image pickup picture units $E_{11}$ to $E_{mn}$ and one of the MOS FETs $T'_1$ to $T'_n$ disposed outside of this one image pickup picture unit and serving as a switching element in one specific construction for the above-mentioned solid state image pickup device 10. In the illustrated embodiment, N-type regions 12, 13, 14 and 15 are formed in a P-type semiconductor substrate 11. A gate electrode 17 is placed on an insulating layer 16 extending between and over the regions 12 and 13 to form one S of the enhancement-mode MOS FETs $S_{11}$ to $S_{mn}$ with the region 12 serving as a source and the region 13 serving as a drain. A gate electrode 18 is placed on an insulating layer 16 extending between and over the regions 14 and 15 to form one T' of the depletion-mode MOS FETs $T'_1$ to $T'_n$ with the region 14 serving as a source and the region 15 serving as a drain. The channel portion in the MOS FET T' is inverted into the N type previously by ion implantation process or diffusion process. The region 13 serving as the drain of the MOS FET S and the region 14 serving as the source of the MOS FET T' are connected by a common electrode 19. The MOS FET T' has a drain electrode 20 placed on the region 15 and connected to the output resistor 4 and the output terminal 6. The semiconductor substrate 11 and the region 12 jointly provide a P-N junction which constitute a photodiode serving as one D of photoelectric transducers $D_{11}$ to $D_{mn}$ for converting the energy of light falling on the region 12 into an electric signal. The semiconductor substrate 11 is grounded.

Figure 6:
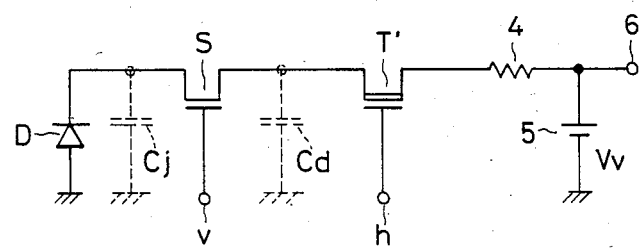

The arrangement of FIG. 5 in which the photoelectric transducer D is composed of the photodiode is shown in FIG. 6 in the form of an equivalent circuit. The photoelectric transducer D has one terminal grounded and the other terminal connected to the source of the enhancement-mode MOS FET S. The drain of the MOS FET S is connected to the source of a depletion mode MOS FET T' having a drain connected to the output terminal 6 and through the output resistor 4 to the power supply 5. The gate of the MOS FET S is connected to one v of the control terminals $v_1$ to $v_m$, while the gate of the MOS FET T' is connected to one h of the control terminals $h_1$ to $h_n$.

The solid state image pickup device 10 of the invention thus arranged performs the image pickup operation in the same manner as that of the solid state image pickup device shown in FIG. 1. In brief, when light from an object falls on the image pickup picture units $E_{11}$ to $E_{mn}$ on the image pickup surface, signal charge (electrons) dependent on the quantity of incident light is stored in the sources of the MOS FETs $S_{11}$ to $S_{mn}$ in the image pickup picture units $E_{11}$ to $E_{mn}$. Then, when the vertical scanning signals $\Phi_{v1}$ to $\Phi_{vm}$ as shown in FIG. 3A are supplied from the vertical scanning circuit 2 through the control terminals $v_1$ to $v_m$ to the gates of the enhancement-mode MOS FETs $S_{11}$ to $S_{mn}$, the horizontal rows of the MOS FETs $S_{11}$ to $S_{mn}$ are successively turned on, and when the horizontal scanning signals $\Phi_{h1}$ to $\Phi_{hm}$ as shown in FIG. 3B are supplied from the horizontal scanning circuit 3 through the control terminals $h_1$ to $h_m$ to the gates of the depletion-mode MOS FETs $T'_1$ to $T'_n$, the MOS FET $T'_1$ to $T'_n$ are successively turned on, so that a signal based on the signal charge stored in the sources of the MOS FETs $S_{11}$ to $S_{mn}$ is delivered to the output terminal 6 to produce an image pickup signal output thereat.

The derivation of the image pickup signal output from one image pickup picture unit E on the image pickup surface of the solid state image pickup device 10 according to the present invention will be further considered with reference to FIGS. 5 and 6. When the signal charge (electrons) is stored in the junction capacitance $C_j$ across the P-N junction constituting the photoelectric transducer D connected to the source of the MOS FET S, the source potential of the MOS FET S is lowered by $\Delta V_S$ from the level $V_V$ corresponding to the operation voltage $V_V$ of the power supply 5. The drain of the MOS FET S is accompanied with the stray capacitance $C_d$ ($C_d >> C_j$), and when the MOS FET S is turned on, the drain potential thereof is lowered by:

$$\Delta V_d = \frac{C_j}{C_j + C_d} \Delta V_s$$

from the level $V_V$. This operation is the same as that of the solid state image pickup device 1 shown in FIG. 1.

The source potential of the MOS FET S can vary from $V_V$ to ground level. Assuming that this enhancement-mode MOS FET S has the threshold voltage $V_{th}$ ($V_{th} > 0$), the level of the pulse $\phi_v$ of the vertical scanning signal $\Phi_v$ required to energize the MOS FET S to be conductive should reach at least $V_V + V_{th}$, and the low level portion of the vertical scanning signal $\Phi_v$ required to keep the MOS FET S to be nonconductive should be $V_{th}$ or smaller. Therefore, in this case also, the vertical scanning signal $\Phi_v$ required to turn the MOS FET S on and off without fail should have the low level portion of a level of $V_{th} - V'$ and the pulse $\phi_v$ of a level of $V_V + V_{th} + V'$ (where $V'$ is the marginal voltage).

Further, assuming that the depletion mode MOS FET T has a threshold voltage $-V'_{th}$ ($V'_{th} > 0$), since the source potential of the MOS FET T' is equal to the drain potential of the MOS FET S and varies from the level $V_V$ to the level $V_V - \Delta V_d$, the level of the pulse $\phi_h$ of the horizontal scanning signal $\Phi_h$ required to energize the MOS FET T' to be conductive should reach at least $V_V - V'_{th}$, and the low level portion of the horizontal scanning signal $\Phi_h$ required to keep the MOS FET T' to be nonconductive should be $V_V - \Delta V_d - V'_{th}$ or lower. Accordingly, the horizontal scanning signal $\Phi_h$ required to turn the MOS FET T' on and off without fail should have the low level portion of a level of $V_V - \Delta V_d - V'_{th} - V'$ and the pulse $\phi_h$ of a level of $V_V - V'_{th} + V'$.

It follows from the foregoing that, with the solid state image pickup device of the present invention, the vertical scanning signal $\Phi_v$ remains the same as that in the conventional solid state image pickup device, but the horizontal scanning signal $\Phi_h$ has its low level portion and pulse $\phi_h$ which can be lowered in level by $V_{th} - (-V'_{th}) = V_{th} + V'_{th}$ compared with those in the case of the conventional device. Accordingly, the level of the pulse $\phi_h$ of the horizontal scanning signal $\Phi_h$ may remain low even when the low level portion of the horizontal scanning signal $\Phi_v$ is equalized to the low level portion of the vertical scanning $\Phi_h$ for the sake of the scanning circuits, and the amplitude of the pulse $\phi_h$ is therefore lower than the amplitude $V_V + 2V'$ of the pulse $\phi_v$ of the vertical scanning signal $\Phi_v$ by the level $V_{th} + V'_{th}$. This results in that the burden on the horizontal scanning circuit is not appreciably increased, and the condition is more advantageous for the potential durability of the MOS FET T'.

Further, even if the low level portion of the horizontal scanning signal $\Phi_h$ is set to be ground level, the amplitude of the pulse $\phi_h$ can be made smaller by the level $V'_{th} + V'_{th}$ compared with that in the case of the conventional device. This is highly advantageous in designing the shift register which constitutes the horizontal scanning circuit. Besides, by equalizing the level of the low level portion of the horizontal scanning signal $\Phi_h$ to ground level, the horizontal scanning circuit can dispense with a voltage supply terminal which would serve to increase the level of the low level portion of the horizontal scanning signal $\Phi_h$ to be higher than ground level. This also results in the advantage that the number of external pins of an integrated circuit unit can be reduced in the case where the horizontal scanning circuit is formed into an integrated circuit.

Figure 7:
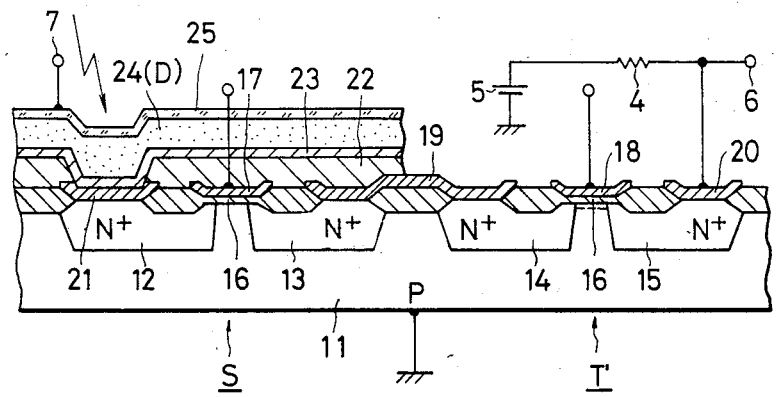
FIG. 7 is a cross-sectional view of another specific construction for a portion of the solid state image pickup device shown in FIG. 4.

FIG. 7 is illustratative of a cross section of one E of image pickup picture units $E_{11}$ to $E_{mn}$ and one T' of depletion-mode MOS FETs $T'_1$ to $T'_n$ serving as switching elements in another specific construction for the solid stage image pickup device of the present invention. In this construction, N-type regions 12, 13, 14 and 15 are formed in a P-type semiconductor substrate 11. One S of enhancement-mode MOS FETs $S_{11}$ to $S_{mn}$ which has a gate electrode 17, the region 12 serving as a source and the region 13 as a drain is formed, and one T' of depletion-mode MOS FETs $T'_1$ to $T'_n$ which has a gate electrode 18, the region 14 serving as a source and the region 15 as a drain is also formed. The drain of the MOS FET S and the source of the MOS FET T' are connected to each other by a common electrode 19. The MOS FET T' has a drain electrode 20 placed on the region 15, and in addition the MOS FET S has a source electrode 21 placed on the region 12.

An insulating layer 22 is deposited on the MOS FET S except for the source electrode 21, and an electrode 23 composed of an aluminum layer is placed on the insulating layer 22 and is connected to the source electrode 21. On the electrode 23, there is deposited a photoelectric conversion layer 24 composed of a thin layer of amorphous silicon. A transparent electrode (target electrode) 25 is disposed over the photoelectric conversion layer 24. A region of the photoelectric conversion layer 24 spreading over the MOS FET S forms one D of the photoelectric transducers $D_{11}$ to $D_{mn}$. In this embodiment, therefore, the respective photoelectric transducers $D_{11}$ to $D_{mn}$ are not composed of independent photodetecting elements such as photodiodes, but each composed of one region of the photoelectric conversion layer 24 extending over the photodetecting surface. Light falling on the image pickup surface is transmitted through the target electrode 25. In this case, the semiconductor substrate 11 is grounded, and the target electrode 25 is supplied with a target voltage $V_T$ in the form of a predetermined DC voltage from the terminal 7.

The above arrangement in which the photoelectric transducers $D_{11}$ to $D_{mn}$ are composed of the photoelectric conversion layer has also the advantage resulting from the fact that the switching elements turned on and off by the horizontal scanning signals $\Phi_{h1}$ to $\Phi_{hn}$ are formed with the depletion-mode MOS FETs $T'_1$ to $T'_n$ in the same manner as the arrangement in which the photoelectric transducers $D_{11}$ to $D_{mn}$ are composed of the photodiodes.

Applicability for Industrial Use

As described above, the solid state image pickup device according to the present invention can reduce the burden on the scanning circuit for turning on and off a plurality of switching elements which are contained therein and operative to produce an image pickup signal output and can also improve various characteristics thereof. Accordingly, the solid state image pickup device of the invention is suitable for use in small-size, lightweight sophisticated television cameras.

We claim:

1. A solid state image pickup device comprising a plurality of image pickup picture units ($E_{11}$ to $E_{mn}$) arrayed in horizontal and vertical rows and composed of a first plurality of switching elements ($S_{11}$ to $S_{mn}$) and a plurality of photoelectric transducers ($D_{11}$ to $D_{mn}$:24) electrically connected to said first plurality of switching elements ($S_{11}$ to $S_{mn}$), and each of said first plurality of switching elements ($S_{11}$ to $S_{mn}$) composed of enhancement-mode insulated-gate field-effect transistors and a second plurality of switching elements ($T'_1$ to $T'_n$) connected in common to the respective vertical rows of said first plurality of switching elements ($S_{11}$ to $S_{mn}$) in said image pickup picture units ($E_{11}$ to $E_{mn}$) and each of said second plurality of switching elements composed of a depletion-mode insulated-gate field-effect transistor, and an arrangement wherein the horizontal rows of said first plurality of switching elements ($S_{11}$ to $S_{mn}$) in the image pickup picture units ($E_{11}$ to $E_{mn}$) are selectively energizable and said second plurality of switching elements ($T'_1$ to $T'_n$) are selectively energizable to deliver signals based on signal charges generated by said plurality of photoelectric transducers ($D_{11}$ to $D_{mn}$) through said first and second plurality of switching elements ($S_{11}$ to $S_{mn}$, $T'_1$ to $T'_n$) so as to produce an image pickup signal output and wherein said second plurality of switching elements ($T'_1$ to $T'_n$) which comprise depletion-mode insulated-gate field-effect transistors have their sources respectively connected to the sources connected in common of the vertical rows of said plurality of enhancement-mode insulated-gate field-effect transistors which constitute said first switching elements ($S_{11}$ to $S_{mn}$) in said plurality of image pickup picture units ($E_{11}$ to $E_{mn}$), and the drains of said plurality of said depletion mode transistors connected in common to an output terminal (6).

* * * * *